United States Patent
Scott et al.

(10) Patent No.: US 9,319,005 B2
(45) Date of Patent: Apr. 19, 2016

(54) MULTI-BAND/MULTI-MODE POWER AMPLIFIER WITH SIGNAL PATH HARDWARE SHARING

(75) Inventors: Baker Scott, San Jose, CA (US); George Maxim, Milpitas, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 221 days.

(21) Appl. No.: 13/551,473

(22) Filed: Jul. 17, 2012

(65) Prior Publication Data

US 2014/0015603 A1    Jan. 16, 2014

Related U.S. Application Data

(60) Provisional application No. 61/671,598, filed on Jul. 13, 2012.

(51) Int. Cl.
| | | |
|---|---|---|
| H03F 3/68 | (2006.01) | |
| H03F 1/56 | (2006.01) | |
| H03F 3/195 | (2006.01) | |
| H03F 3/24 | (2006.01) | |

(52) U.S. Cl.
CPC .............. *H03F 1/56* (2013.01); *H03F 3/195* (2013.01); *H03F 3/245* (2013.01); *H03F 3/68* (2013.01); *H03F 2200/111* (2013.01); *H03F 2200/222* (2013.01); *H03F 2200/294* (2013.01); *H03F 2200/387* (2013.01); *H03F 2200/405* (2013.01); *H03F 2200/429* (2013.01); *H03F 2203/7209* (2013.01); *H03F 2203/7215* (2013.01); *H03F 2203/7221* (2013.01); *H03F 2203/7236* (2013.01)

(58) Field of Classification Search
CPC ............... H03F 3/68; H03F 2200/111; H03F 2200/372; H03F 2200/294; H03F 3/211; H03F 3/72; H03F 1/0294; H03F 1/33; H03F 3/195; H03F 1/0277; H03F 3/24; H01L 29/7839; H01L 25/0204; H01L 1/0031; H01L 2025/03426; H03H 7/463; H03H 9/706; H04B 7/0413; H04B 1/0483; H04J 3/1694; H04J 14/0209; H04J 1/08; H04J 3/00
USPC ......................................... 330/126, 147, 148
See application file for complete search history.

(56) References Cited

U.S. PATENT DOCUMENTS

| | | | |
|---|---|---|---|
| 6,654,516 B2 * | 11/2003 | So ................................... | 385/27 |
| 6,946,987 B1 * | 9/2005 | Van Blerkom et al. ........... | 330/9 |
| 6,977,546 B2 | 12/2005 | Stapleton | |
| 7,072,592 B2 * | 7/2006 | Sarraf ............................ | 398/208 |
| 7,383,024 B2 | 6/2008 | Mueller et al. | |
| 7,388,428 B2 | 6/2008 | Wiegner et al. | |
| 7,636,554 B2 | 12/2009 | Sugar et al. | |
| 7,656,228 B2 * | 2/2010 | Fukuda et al. ................ | 330/126 |

(Continued)

*Primary Examiner* — Khanh V Nguyen
(74) *Attorney, Agent, or Firm* — Withrow & Terranova, P.L.L.C.

(57) ABSTRACT

Existing multi-band/multi-mode (MB/MM) power amplifiers (PAs) use separate signal paths for the different covered frequency bands. This results in a large degree of hardware duplication and to a large die size and cost. Solutions that achieve hardware sharing between the different signal paths of MB/MM PAs are shown. Such sharing includes bias circuit and bypass capacitors sharing, as well as sharing front-end stages and the output stage of the PA. Signal multiplexing may be realized in the transmitter or at the PA front-end while the signal de-multiplexing can be realized either in the PA output stage or at the front-end of the output stage. Such circuits can be applied with saturated and linear MB/MM PAs with adjacent or non-adjacent bands.

12 Claims, 8 Drawing Sheets

(56) References Cited

U.S. PATENT DOCUMENTS

| | | |
|---|---|---|
| 7,773,956 B2 | 8/2010 | Fukamachi et al. |
| 7,808,312 B2 | 10/2010 | Ichitsubo et al. |
| 7,912,499 B2 | 3/2011 | Ouzillou |
| 8,115,598 B2 * | 2/2012 | Rofougaran et al. ........ 340/10.1 |
| 8,130,735 B2 | 3/2012 | Rofougaran |
| 8,543,006 B2 * | 9/2013 | Vassilieva et al. ............ 398/158 |
| 2007/0285764 A1 * | 12/2007 | Sugliani et al. ................ 359/334 |
| 2008/0285982 A1 * | 11/2008 | Eiselt et al. .................... 398/178 |
| 2009/0109853 A1 * | 4/2009 | Fenech et al. ................. 370/235 |
| 2012/0319772 A1 * | 12/2012 | Chang ...................... 330/124 R |
| 2013/0101288 A1 * | 4/2013 | Graham et al. ................. 398/49 |

\* cited by examiner

MULTI-BAND/MULTI-MODE POWER AMPLIFIER WITH SIGNAL PATH HARDWARE SHARING

CROSS-REFERENCE TO RELATED APPLICATIONS

This application claims the benefit of U.S. Provisional Patent Application No. 61/671,598 filed Jul. 13, 2012.

BACKGROUND OF THE INVENTION

1. Field of the Invention

The invention generally relates to multi-band/multi-mode power amplifiers and more particularly to multi-band/multi-mode power amplifiers that share hardware of the signal path.

2. Prior Art

Figure 1:
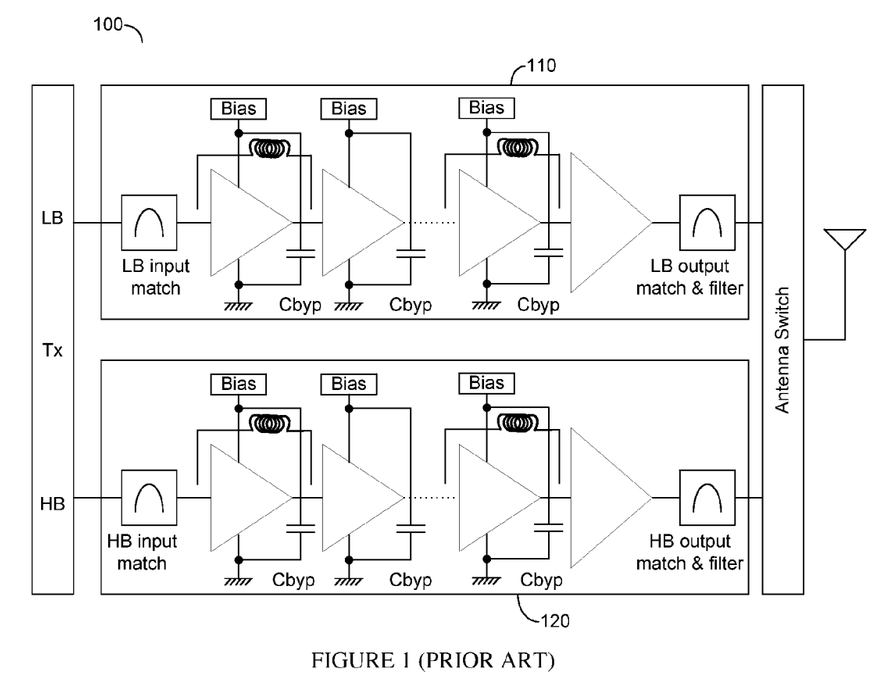
FIG. 1 is a schematic block diagram of a multi-band power amplifier with separate signal paths each using a narrowband tuned circuits (prior art).

Prior art multi-band/multi-mode (MB/MM) power amplifiers (PAs) use separate signal paths for each supported band. FIG. 1 shows such an exemplary prior art multi-band PA 100 having a low-band (LB) signal path 110 and a high-band (HB) signal path 120. It is usually the case that the bypass capacitors of the radio frequency (RF) signal path stages dominate the die area on which the PA is implemented. Having two separate signal paths results in a duplication of the bypass capacitors and thus requiring a much larger die area. If more than two signal paths are used then the hit grows proportionately.

Having separate signal paths results in duplication of circuits, such as, the bias circuits of each of the signal paths. Furthermore, the separate signal paths use frequency tuned stages that can usually cover only a single band, or at best few closely spaced bands, e.g., two adjacent bands. It would therefore be readily understood by those of ordinary skill in the art that the prior art suffers from several drawbacks with respect to MB/MM PAs, namely, increased die area and complexity, which in turn also impact the cost of the solution.

Therefore, in view of the deficiencies of the prior art, it would be advantageous to provide a solution that overcomes these deficiencies.

DETAILED DESCRIPTION OF THE PREFERRED EMBODIMENTS

Existing multi-band/multi-mode (MB/MM) power amplifiers (PAs) use separate signal paths for the different covered frequency bands. This results in a large degree of hardware duplication and to a large die size and cost. Solutions that achieve hardware sharing between the different signal paths of a MB/MM PAs are shown. Such sharing includes bias circuit and bypass capacitors sharing, as well as sharing front-end stages and the output stage of the PA. Signal multiplexing may be realized in the transmitter or at the PA front-end while the signal de-multiplexing can be realized either in the PA output stage or at the front-end of the output stage. Such circuits can be applied with saturated and linear MB/MM PAs with adjacent or non-adjacent bands.

A multi-band PA system may use multiple bands belonging to the same standard, or bands belonging to several different communication standards, also called modes. In this document such PAs shall be referred to as MB/MM PAs. However, it should be understood that the inventions disclosed herein apply to single-mode (standard) and multi-mode PAs.

Accordingly, this invention discloses solutions for achieving a lower die area and lower cost for a multi-band PA. This is achieved by careful sharing of hardware components between the different bands of the signal paths. The signal paths of the different bands from a multi-band PA consist of rather similar circuits and constitute a large overhead due to the hardware duplication, which according to the principles disclosed herein below, are avoided. Such sharing was not possible in the past because of the need to tune each signal path to a specific frequency band.

Multi-Band PA Using a Broadband PA Signal Path

Figure 2A:
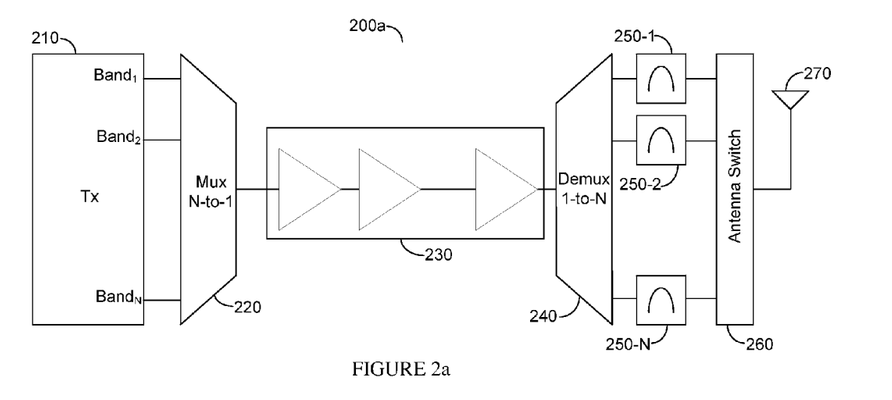
FIG. 2a is a schematic block diagram of a multi-band power amplifier sharing hardware between different bands using an N:1 multiplexer.
Figure 2B:
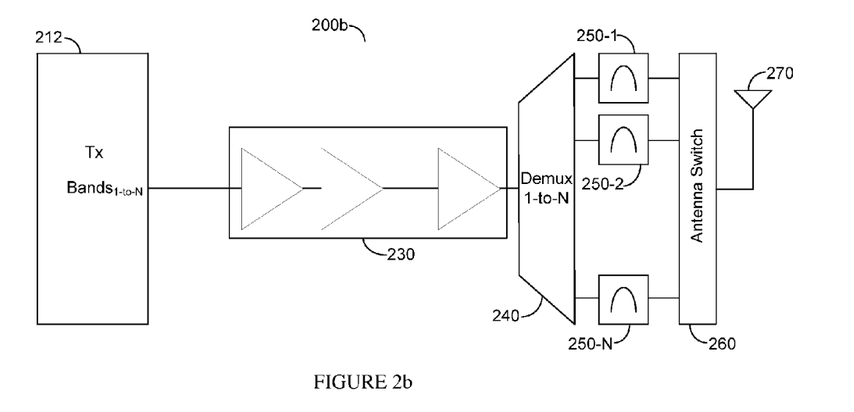
FIG. 2b is a schematic block diagram of a multi-band power amplifier sharing hardware between different bands.
Figure 2C:
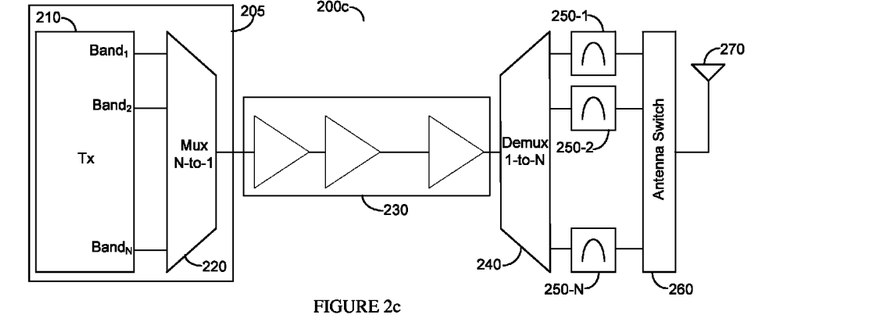
FIG. 2c is a schematic block diagram of a multi-band power amplifier sharing hardware between different bands using a transmitter with an integrated N:1 multiplexer.
Figure 2D:
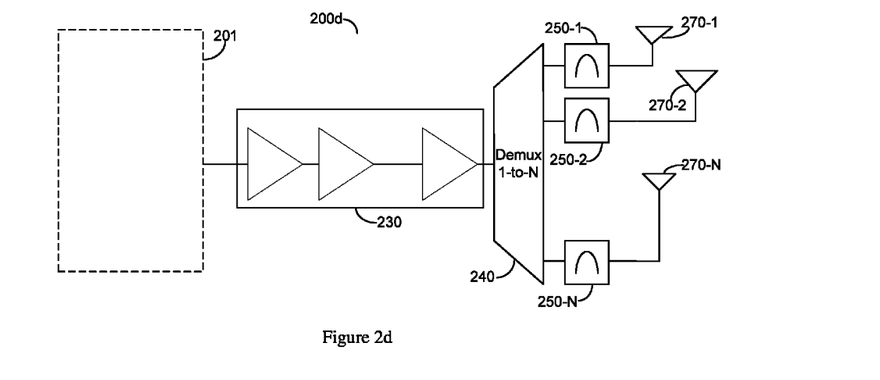
FIG. 2d is a schematic block diagram of a multi-band power amplifier sharing hardware between different bands for coupling with a plurality of antennas.
Figure 2E:
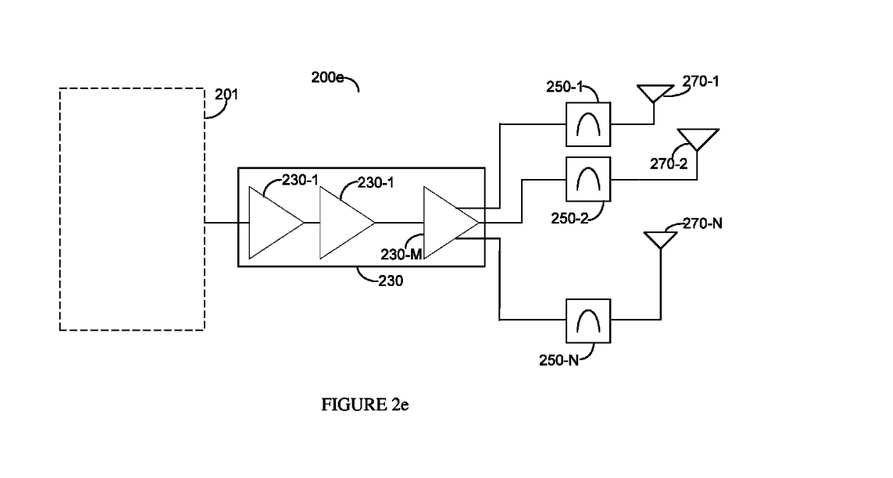
FIG. 2e is a schematic block diagram of a multi-band power amplifier wherein the output power amplifier or the wideband power amplifier signal path 230 has an integrated demultiplexer.
Figure 2F:
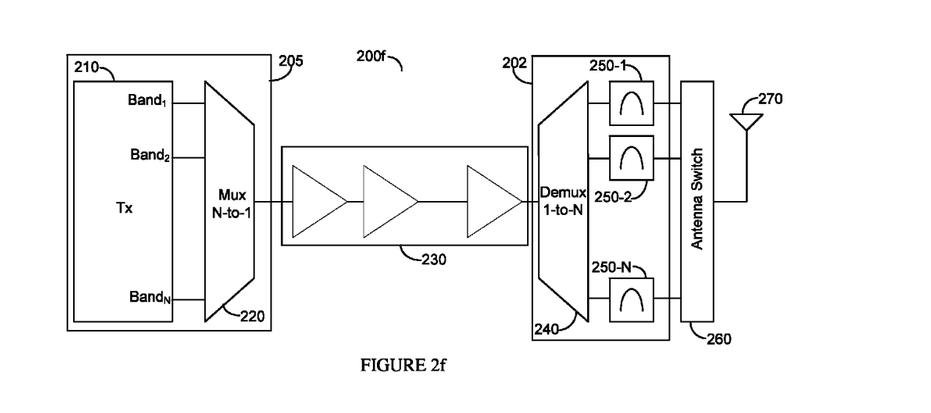
FIG. 2f is a schematic block diagram of a multi-band power amplifier wherein the demultiplexer is an integral part of an output stage comprising passive output matching and the harmonic rejection filters 250.
Figure 2G:
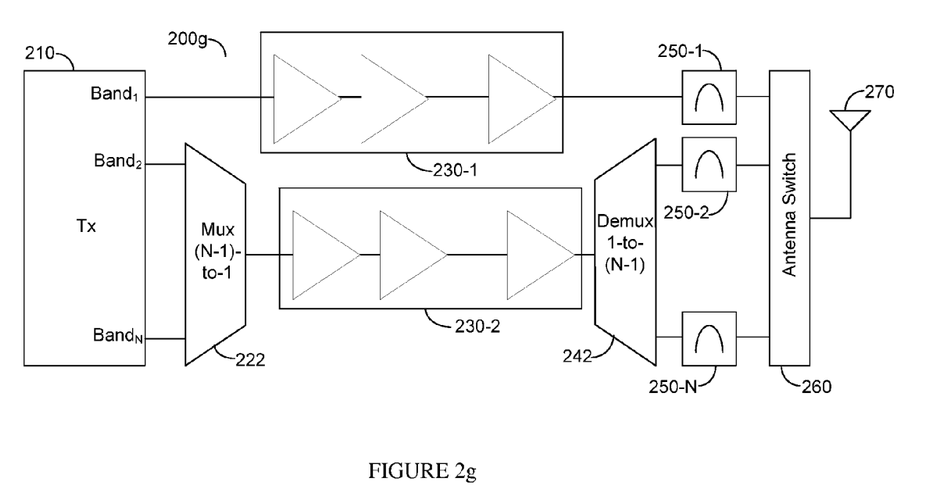
FIG. 2g is a schematic block diagram of a multi-band power amplifier wherein not all signal paths share a single power amplifier signal path.

FIG. 2a depicts an exemplary and non-limiting schematic block diagram 200 of a multi-band power amplifier sharing hardware between different bands using an N-to-1 multiplexer implemented according to principles of the invention. Since the input signal level for the different bands and/or standards is usually compatible, the sizes of the front-end and middle stages from the different bands signal paths are thus compatible in size. Therefore, a wideband signal path can allow hardware sharing between the different bands and/or standards. A transmitter (Tx) 210 provides a plurality of frequency bands, $Band_1, Band_2, \ldots, Band_N$ the output respective of each being provided to a N-to-1 multiplexer 220. It should be noted that the multiplexing may be done either on the TX 210 backend or the PA signal path 230 front-end. The output of the multiplexer 220 is provided to a PA signal path 230 that comprises of one or more wideband amplifiers that can handle the full spectrum of the plurality of bands. The output of the PA signal path 230 is provided to an 1-to-N demultiplexer 240. It should be noted that the band demultiplexing can be done either at the PA signal path 230 backend or the harmonic filter 250 front-end. The N outputs of the demultiplexer 240 are provided to N match and harmonic rejection filters 250-1, 250-2, . . . , 250-N corresponding to each of the bands Band$_1$, Band$_2$, . . . , Band$_N$. The outputs of the match and harmonic rejection filters 250-1, 250-2, . . . , 250-N are provided to an antenna switch 260 that feeds the antenna 270. As a result of this approach the number of amplifiers used is dramatically reduced and the benefit increases as more bands are in use. A person of ordinary skill in the art would readily appreciate that the transmitter 210 and the multiplexer 220 may be replaced by a single path multi-band transmitter 212, shown in exemplary and non-limiting FIG. 2b, without departing from the scope of invention. In yet another embodiment, shown in the exemplary and non-limiting FIG. 2c, an integrated transmitter 205 comprises a transmitter 210 and an N-to-1 multiplexer 220 as an integrated unit. In yet another embodiment, shown in the exemplary and non-limiting FIG. 2d, regardless of the type of input elements illustratively referred to as element 201 and described for example in FIGS. 2a, 2b and 2c, an antenna switch 260 is not used and instead a plurality of antennas 270-1 through 270-N are coupled to the respective outputs of the harmonic rejection filters 250-1 through 250-N. In yet another embodiment, shown in the exemplary and non-limiting FIG. 2e, the output PA 230-M, or the wideband PA signal path 230, has an integrated demultiplexer. In yet another embodiment, shown in the exemplary and non-limiting FIG. 2f, the demultiplexer 240 is an integral part of an output stage 202 comprising passive output matching and the harmonic rejection filters 250. In yet another embodiment, shown in the exemplary and non-limiting FIG. 2g, not all the paths share a single PA path, rather, bands 2-to-N share a common signal PA path 230-2, using a multiplexer 222 adjusted for the smaller number of inputs than N, and a demultiplexer 242 having a smaller number of outputs than N, and a band, for example Band$_1$, having its own signal PA path 230-1 that is coupled to the harmonic rejection filter 250-1. In this case partial sharing is achieved. Other combinations may also be used for partial sharing, all to be understood to be within the scope of the invention. Therefore a PA can have a partially shared architecture in which some stages share hardware, while other stages may not use hardware sharing. In general, sharing hardware has more benefits in back-end stages operating at higher power, and less benefit in the low-power front-end stages.

As noted above, the frontend the signal multiplexing can be realized either inside of the Tx 210 transceiver, that will have a single shared output, or, in the PA signal path 230 itself, if the Tx 210 has separate outputs for the different bands. At backend the demultiplexing can be realized either in the harmonic reject filters 250 by using a wideband output matched or a movable output match, or, inside of the PA signal path 230 itself, for example in the final output stage of the PA signal path 230. Depending on the exact place where the signal multiplexing and demultiplexing is performed, different levels of hardware sharing between the signal paths of a multi-band PA can be achieved.

In one embodiment of the invention the demultiplexer 240 can be eliminated by using filters with multiple pass bands and even tracking (variable) frequency filters. However, use of such filters may come at the expense of the die area savings and hence should be carefully reviewed.

MB/MM PA with Shared Bias Circuits and Bypass Capacitors

Figure 3:
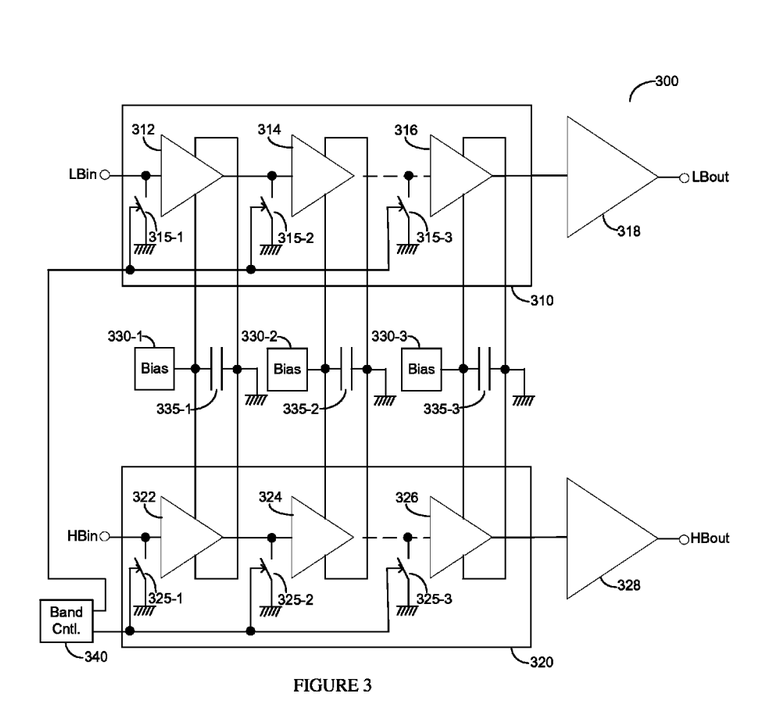
FIG. 3 is a schematic diagram of a multi-band power amplifier sharing bias circuits and bypass capacitors between different bands.

FIG. 3 depicts an exemplary and non-limiting schematic diagram of a multi-band power amplifier 300 for sharing bias circuits 330 and bypass capacitors 335 between different bands, implemented according to principles of the invention. Since the bias circuits 330 and the bypass capacitors 335 are components that make the major contributions to the PA die area, the sharing approach disclosed herein can result in significant PA die area reduction. Accordingly, the multi-band PA 300 comprises a LB signal path 310 having a low-noise amplifier (LNA) stage 312, a pre-driver stage 314, a driver stage 316 and an output stage 318, and a complement HB signal path 320 similarly comprised and adjusted for the higher frequencies having a low-noise amplifier (LNA) stage 322, a pre-driver stage 324, a driver stage 326 and an output stage 328. In some embodiments a lower number of stages may be used in the signal path, while in others cases a larger number of stages may be used. The specific embodiment discussed herein should therefore not be viewed as limiting the scope of the invention.

A band control circuit 240 control the operation of either the LB path 310 or the HB path 320 as may be appropriate. The bias circuits 340-1, 340-2, and 340-3, are shared with the LNA stage 312, the pre-driver stage 314, and driver stage 316 of the LB signal path 310 and HB signal path 320 respectively. Similarly, the bypass capacitors 335-1, 335-2, and 335-3, are shared with the LNA stage 322, the pre-driver stage 324, and driver stage 326 of the LB signal path 310 and HB signal path 320 respectively. The band control 340 and its corresponding switches 315 and 325 prevent loading from one band to the other band, switches 315-1, 315-2, 315-3, 325-1, 325-2, 325-3 being small size band-select switches. A hybrid multi-band PA can be implemented where some stages share hardware while other stages do not share hardware. As noted above, hardware sharing has more benefits for back-end high-power stages and less for front-end stages that inherently operate in lower power. A person of ordinary skill in the art would readily appreciate that this technique can be equally used for voltage or current biasing as the case may be. Furthermore, it can be used by both saturated and linear multi-band PAs. Moreover, the bias circuits and bypass capacitors sharing can be extended to be used between consecutive stages of the signal path, resulting in a broader sharing of the hardware and a further reduction of the PA die area.

Wideband Signal Path with No Tuned Circuits

Figure 4A:
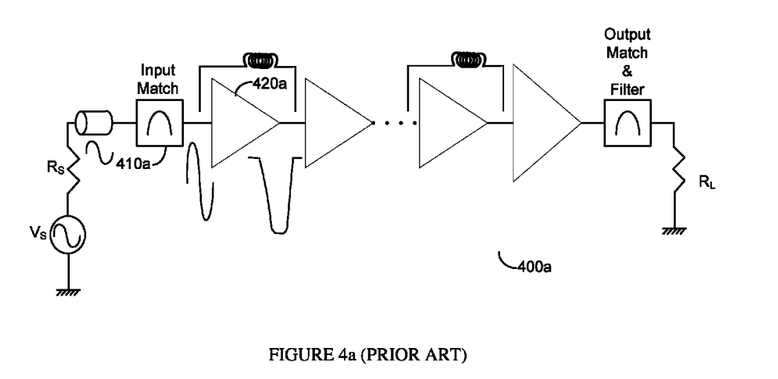
FIG. 4a is a schematic diagram of a signal path with tuned circuits (prior art).
Figure 4B:
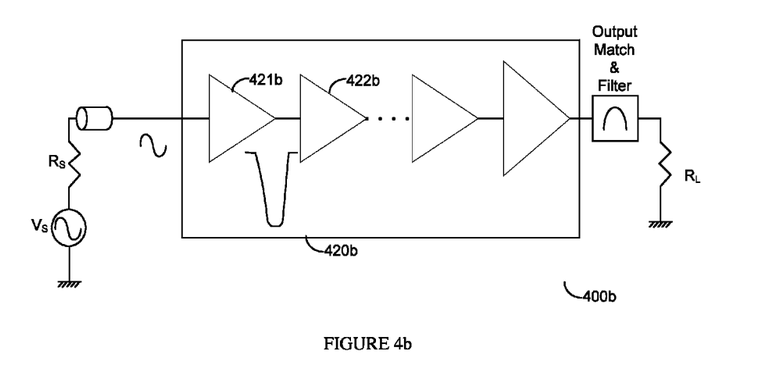
FIG. 4b is a schematic diagram of a signal path eliminating tuned circuits.

In order to implement hardware sharing between the signal paths of different frequency bands, a wideband performance needs to be achieved by eliminating some or all of the tuned circuits from the signal path. Traditionally, the input matching circuits are realized with tuned circuits, resulting in a narrowband nature that can cover one or only few adjacent frequency bands. An exemplary prior art implementation is shown in FIG. 4a. However, FIG. 4b shows an exemplary and non-limiting schematic diagram 400b of a signal path eliminating tuned circuits. An active input impedance matching is realized as part of the first stage of the PA signal path 400b. This allows the elimination of the tuned input match 410a as well as the elimination of any inductive circuit, e.g., equivalent to inductive element 420-a, used to improve the noise performance. In fact FIG. 4b depicts a proposed architecture that replaces the narrowband tuned signal path with a wideband signal path 420b that can cover multiple frequency bands, which are not even necessarily adjacent bands, if so desired. To keep the low noise performance of the PA a large gain is implemented in the first PA stage by keeping the first two stages 421*b* and 422*b* of compatible size. Noise cancellation can be used to further reduce noise in the front-end stage.

Choice of the Place of Signal Multiplexing

Figure 5A:
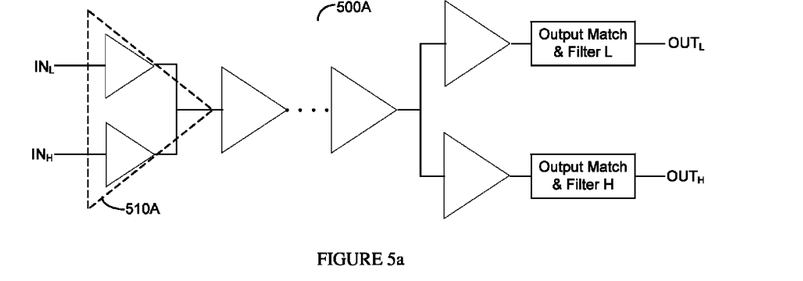
FIG. 5a is a schematic diagram of a multi-band power amplifier signal path with a front stag multiplexing circuit.
Figure 5B:
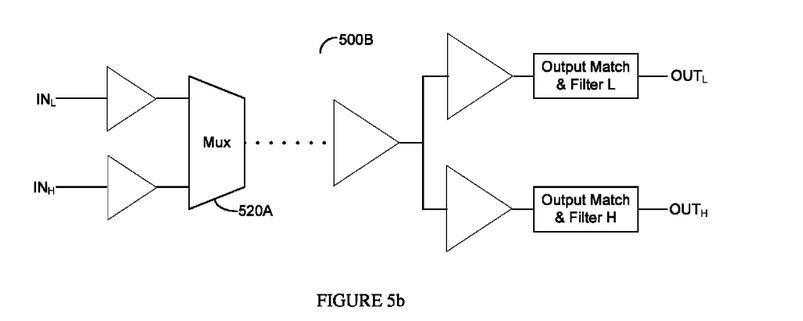
FIG. 5b is a schematic diagram of a multi-band power amplifier signal path with multiplexing realized at the second active stage.
Figure 5C:
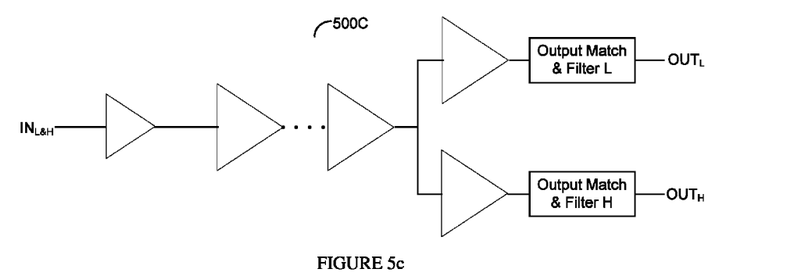
FIG. 5c is a schematic diagram of a multi-band power amplifier signal path without front-end multiplexing circuitry.

Several embodiments are now discussed showing several possible positions of the multiplexing circuit 220. FIG. 5*a* depicts an exemplary and non-limiting schematic diagram 500A of a multi-band power amplifier signal path with a front stage multiplexing circuit 510A. Such a choice may result in worse PA noise performance since multiplexed amplifiers tend to contribute more noise. FIG. 5*b* show another exemplary and non-limiting schematic diagram 500B of a multi-band power amplifier signal path with multiplexing realized at the second active stage. Allowing the first stage to be a fixed amplifier results in better noise performance but reduces the degree of sharing between the different signal paths. FIG. 5*c* is yet another exemplary and non-limiting schematic diagram 500C of a multi-band power amplifier signal path without front-end multiplexing circuitry. For this case the multiplexing actually has to be done in the TX 210, preferably in the digital domain, where there are less noise implications. A person of ordinary skill in the art would readily appreciate that there are trade-offs between the PA noise performance and the amount of hardware sharing that is implemented.

The hardware sharing techniques and embodiments discussed hereinabove can be applied to a single ended signal path, a differential signal path, a quadrature signal path and any combinations thereof. It should be further noted that two or more PAs implemented according to the principles disclosed hereinabove can be used for an even wider band PA. In such a case a first PA using the sharing techniques taught hereinabove could have the higher frequency bands while the other have the lower frequency bands. Then, sharing techniques for the bias circuits and bypass capacitors could be also used.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. A power amplifier (PA) comprising:
   a wideband power amplification radio-frequency (RF) signal path;
   a demultiplexer coupled to an output of the wideband power amplification RF signal path and having a first output for a first frequency band and a second output for a second frequency band, such that the wideband power amplification RF signal path is shared over at least the first frequency band and the second frequency band and the PA is operative in at least one of a multi-band configuration and multi-mode configuration;
   a first match and harmonic filter coupled to the first output;
   a second match and harmonic filter coupled to the second output; and
   an antenna switch coupled to the first match and harmonic filter and the second match and harmonic filter.

2. The PA of claim 1, further comprising a multiplexer having multiplexer inputs coupled to a first frequency band input and a second frequency band input, and having a multiplexer output coupled to an input of the wideband power amplification RF signal path.

3. The PA of claim 2, further comprising a transmitter coupled to the multiplexer.

4. The PA of claim 3, wherein a function of the multiplexer is an integral part of the transmitter.

5. The PA of claim 1, further comprising one of:
   a transmitter having an integrated multiplexer, the transmitter being coupled to the wideband power amplification RF signal path; and
   a single signal path multi-band transmitter coupled to the wideband power amplification RF signal path.

6. The PA of claim 1, further comprising
   an antenna coupled to the antenna switch.

7. The PA of claim 1, wherein the demultiplexer is an integral part of an output stage of the wideband power amplification RF signal path.

8. The PA of claim 1, wherein the demultiplexer is an integral part of an output stage comprising a passive output matching and a harmonic filter.

9. A power amplifier (PA) comprising:
   a wideband power amplification radio-frequency (RF) signal path;
   a demultiplexer coupled to an output of the wideband power amplification RF signal path and having a first output for a first frequency band and a second output for a second frequency band, such that the wideband power amplification RF signal path is shared over at least the first frequency band and the second frequency band and the PA is operative in at least one of a multi-band configuration and multi-mode configuration;
   a first match and harmonic filter coupled to the first output;
   a second match and harmonic filter coupled to the second output; and
   an interface to a plurality of antennas, one for each band of the PA.

10. A power amplifier (PA) comprising:
    a wideband power amplification radio-frequency (RF) signal path; and
    a demultiplexer coupled to an output of the wideband power amplification RF signal path and having a first output for a first frequency band and a second output for a second frequency band, such that the wideband power amplification RF signal path is shared over at least the first frequency band and the second frequency band and the PA is operative in at least one of a multi-band configuration and multi-mode configuration, wherein at least a bias circuit is shared with at least another PA.

11. A power amplifier (PA) comprising:
    a wideband power amplification radio-frequency (RF) signal path; and
    a demultiplexer coupled to an output of the wideband power amplification RF signal path and having a first output for a first frequency band and a second output for a second frequency band, such that the wideband power amplification RF signal path is shared over at least the first frequency band and the second frequency band and the PA is operative in at least one of a multi-band configuration and multi-mode configuration, wherein at least a bypass capacitor is shared with at least another PA.

12. A power amplifier (PA) comprising:
    a wideband power amplification radio-frequency (RF) signal path; and
    a demultiplexer coupled to an output of the wideband power amplification RF signal path and having a first output for a first frequency band and a second output for a second frequency band, such that the wideband power amplification RF signal path is shared over at least the first frequency band and the second frequency band and the PA is operative in at least one of a multi-band configuration and multi-mode configuration, wherein the PA is operative in a third frequency band different from the first frequency band and the second frequency band and wherein the third frequency band uses at least a power amplification signal path that is different from the wideband power amplification RF signal path.

* * * * *